United States Patent [19]
Havens

[11] Patent Number: 5,945,857
[45] Date of Patent: Aug. 31, 1999

[54] METHOD AND APPARATUS FOR DUTY-CYCLE CORRECTION

[75] Inventor: Joseph Harold Havens, Musashino, Japan

[73] Assignee: Lucent Technologies, Inc., Murray Hill, N.J.

[21] Appl. No.: 09/023,111

[22] Filed: Feb. 13, 1998

[51] Int. Cl.⁶ ...................................................... H03K 5/13
[52] U.S. Cl. .......................... 327/175; 327/172; 327/134; 327/309
[58] Field of Search ...................................... 327/175, 172, 327/134, 309, 316, 77

[56] References Cited

U.S. PATENT DOCUMENTS

| | | | |
|---|---|---|---|
| 4,596,954 | 6/1986 | Haque | 327/116 |
| 4,959,557 | 9/1990 | Miller | 327/175 |
| 5,010,561 | 4/1991 | Itoh | 377/47 |
| 5,057,702 | 10/1991 | Kitagawa | 327/175 |
| 5,572,158 | 11/1996 | Lee | 327/175 |

*Primary Examiner*—Tim Callahan
*Assistant Examiner*—April Giles

[57] ABSTRACT

Correction of a duty-cycle is performed for use with a divide-by-two phase-splitter to increase precision of the duty-cycle of an incoming local oscillator signal in order to provide more precise phase relationships during generation of a phase and amplitude modulated carrier. Phase-splitter input signals are generated by limiting the slew-rate of an incoming signal to produce an intermediate signal. The intermediate signal is clipped in relation to a reference level. The reference level is adjusted by a feedback signal to produce an adjusted duty-cycle signal as an output signal. The feedback signal is proportional to the adjusted duty-cycle signal.

22 Claims, 8 Drawing Sheets

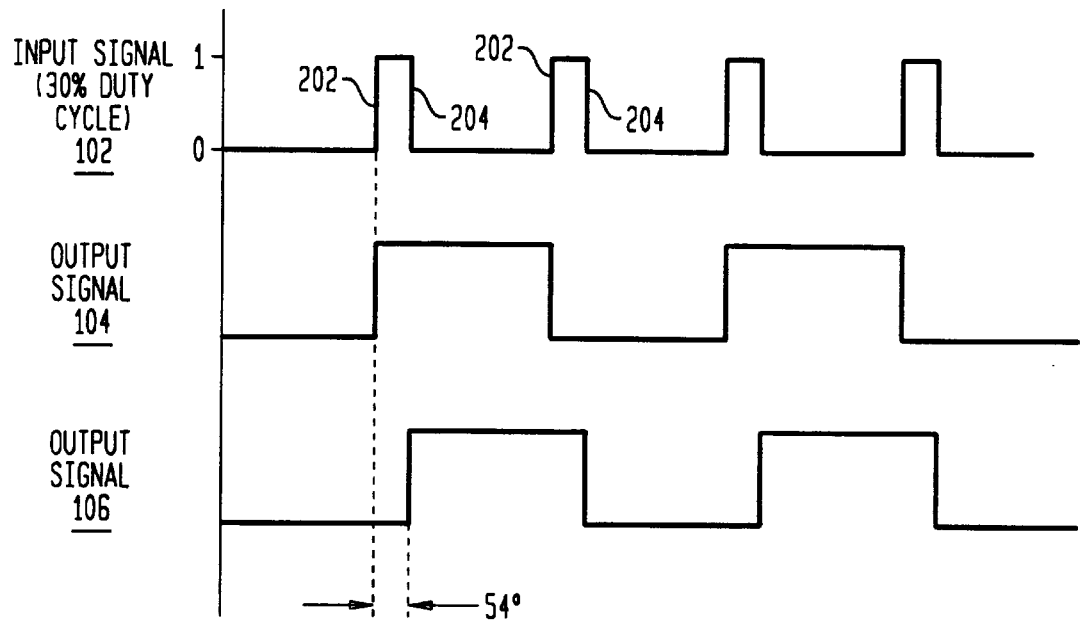
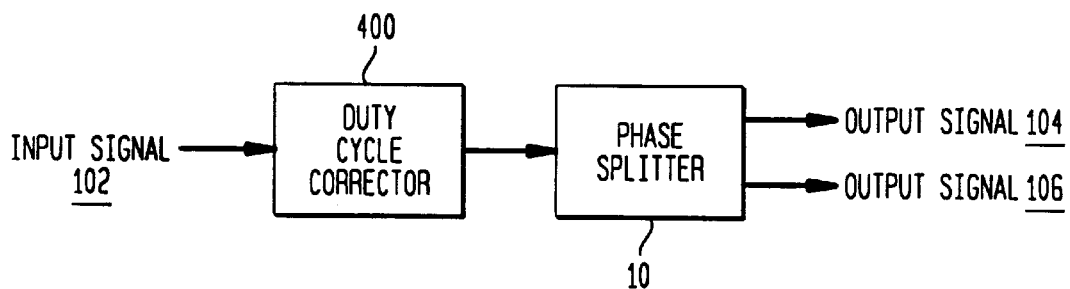

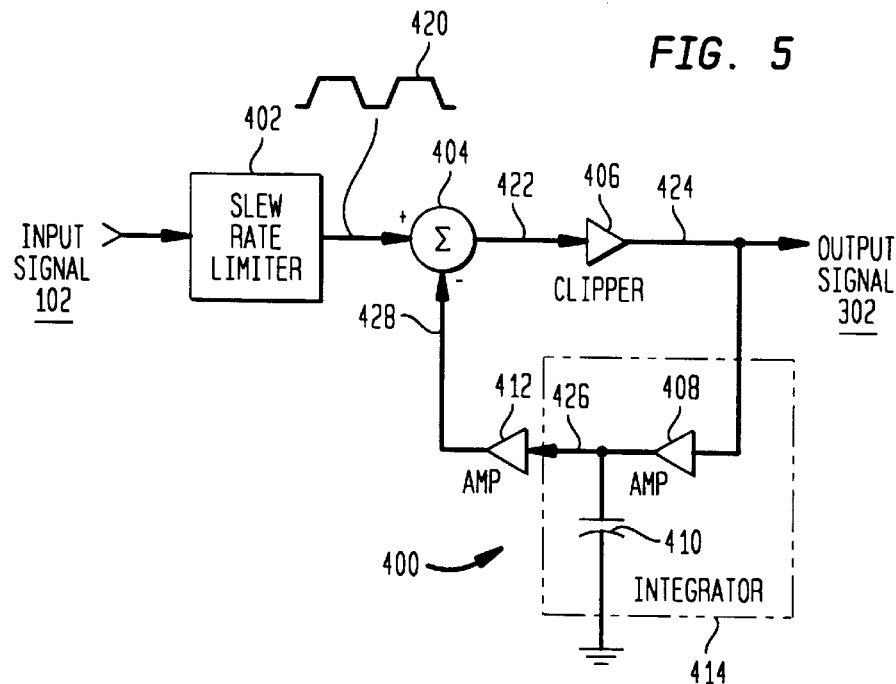
FIG. 5
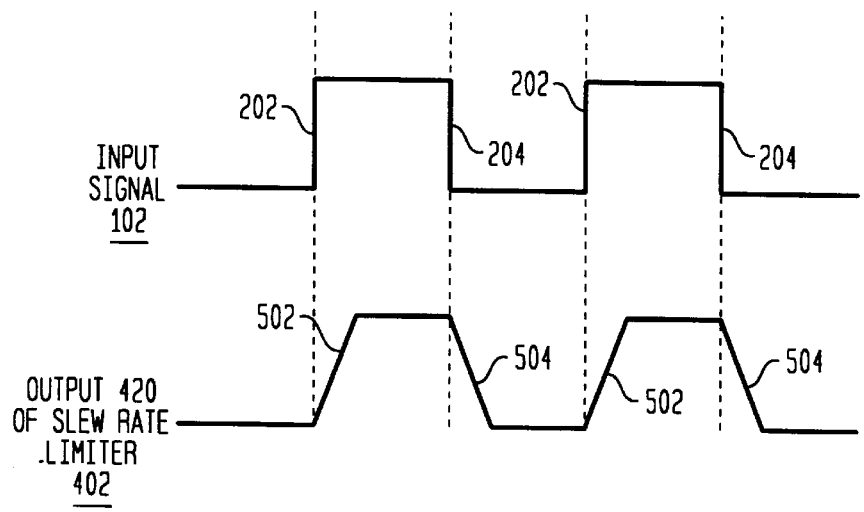
FIG. 6
FIG. 7

METHOD AND APPARATUS FOR DUTY-CYCLE CORRECTION

METHOD AND APPARATUS FOR DUTY-CYCLE CORRECTION

This non-provisional application claims the benefit of U.S. provisional Application entitled "Duty-cycle Correction—Improving the Accuracy of Divide-by-2 Phase-splitters" filed on Nov. 20, 1997. The Applicant of the Provisional Application is Joseph Harold Havens and the attorney Docket No. is Havens 4.

The provisional Application is herein incorporated by reference including all the publications cited therein.

BACKGROUND OF THE INVENTION

1. Field of Invention

This invention relates to a duty-cycle corrector for use with a divide-by-two phase-splitter.

2. Description of Related Art

Phase-splitters may be used in many applications, including digital cellular modulators which require generation of two signals having a 90° phase relationship to facilitate the generation of a phase and amplitude modulated carrier. Although many types of phase-splitters are available (e.g., Resistor-Capacitor, digital divide-by-four, and divide-by-two phase splitters), each type has its own set of benefits and detriments. For example, the digital divide-by-two phase-splitter is conceptually very simple and consists of two flip-flops (see FIG. 1). However, the divide-by-two phase-splitter depends on an input signal with exactly 50% duty-cycle to provide the 90° phase shift relation of output signals. Thus, new techniques are required to improve the divide-by-two phase splitter performance without such stringent requirements.

SUMMARY OF THE INVENTION

A duty-cycle corrector generates an output signal that has a frequency of an input signal and a preset duty-cycle controlled by a negative feedback loop. A phase-splitter receives the output signal and generates signals having precise phase relationships relative to each other for use in generation of phase and amplitude modulated carriers.

The duty-cycle corrector generates an intermediate signal by limiting the slew-rates of the rising and falling edges of the input signal. By biasing the intermediate signal with an offset value and amplifying and clipping the biased intermediate signal, the duty-cycle corrector generates the output signal with a duty-cycle that is directly related to the offset value.

The duty-cycle corrector generates the offset value by feeding the duty-cycle corrector output signal back into an integrator to integrate the output signal. The output of the integrator corresponds to the duty-cycle of the output signal as long as the signal is symmetrical and swings an equal distance above and below zero and the integrator has a finite DC gain. The offset value is a negative feedback signal provided by the negative feedback loop, including the integrator, and biases the intermediate signal to control the output signal duty-cycle. The output of the integrator may be further amplified to adjust the gain of the negative feedback loop and, thus, the precision of the duty-cycle of the output signal.

BRIEF DESCRIPTION OF THE DRAWINGS

The invention is described with reference to the following drawings wherein like numerals reference like elements, and wherein:

FIG. 3 shows waveforms of the divide-by-two phase-splitter when an input signal has a duty-cycle of about 30%;

FIG. 4 shows a block diagram of a duty-cycle corrector and a phase splitter;

FIG. 5 shows a block diagram of the duty-cycle corrector;

FIG. 6 shows a relationship between the input signal and an output of a slew-rate limiter;

FIG. 7 shows the effect of altering the offset value within a clipper;

DETAILED DESCRIPTION OF PREFERRED EMBODIMENTS

Figure 1:
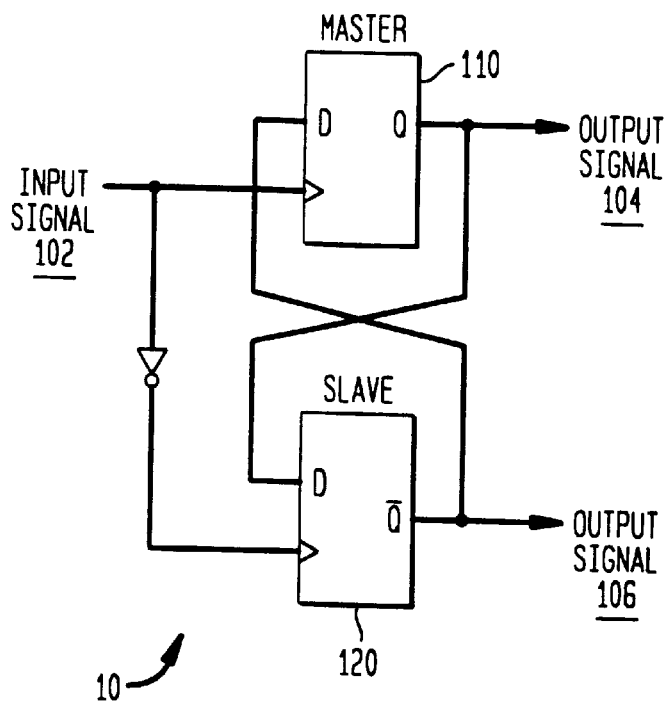
FIG. 1 shows a divide-by-two phase-splitter.

FIG. 1 is an illustration of a divide-by-two phase-splitter 10. A master flip-flop (FF) 110 and a slave FF 120 produce, from a single input signal 102, two output signals 104, 106 differing in phase. The master and slave FFs 110 and 120 are cross coupled so that the master FF 110 is set to the $\overline{Q}$ value of the slave FF on the rising edge of the input signal 102 and the slave FF is set to the Q value of the master FF 110 on the falling edge of the input signal 102. The waveforms of output signals 104, 106 of the master and slave FFs 110, 120, respectively, are shown in FIG. 2 (assuming that initial states of the master and slave FFs are 0 and 1, respectively).

Figure 2:
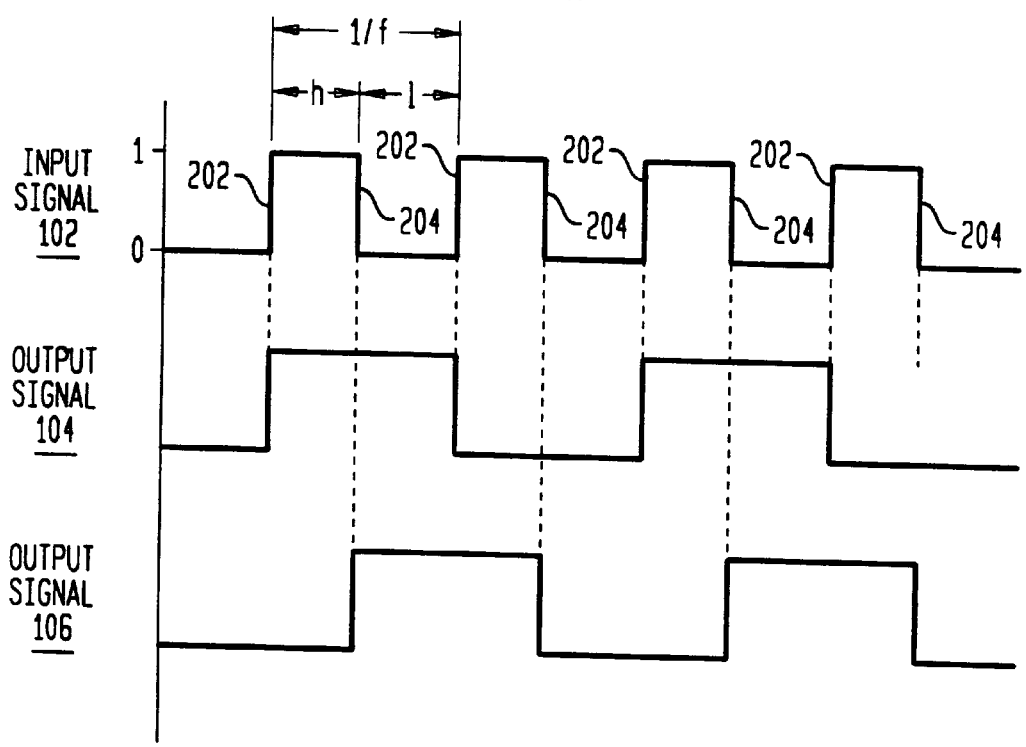
FIG. 2 shows waveforms of an ideal divide-by-two phase-splitter.

In FIG. 2, the output signal 104 transitions only on the rising edges 202 of the input signal 102 and the output signal 106 transitions only on the falling edges 204 of the input signal 102. Thus, a phase relationship between the output signals 104 and 106 directly depends on the duty-cycle of the input signal 102 where the duty-cycle of the input signal 102 is the ratio between the time the input signal 102 is at a 1 during one cycle and the total time period of the cycle. Thus, the divide-by-two phase-splitter 10 requires a very precise duty-cycle of the input signal 102 to provide output signals 104, 106 which have a phase relationship that is precisely 90° out of phase. Therefore, changes in the duty-cycle of the input signal 102 directly result in changes in the phase relationship between the output signals 104, 106.

When a fixed phase relationship between the output signals 104, 106 is desired irrespective of the duty-cycle of the input signal 102 (such as for phase and amplitude modulated carriers), the duty-cycle of an input signal to the phase-splitter 10 must also be fixed. Thus, if the duty-cycle of the input signal 102 is not fixed, then the input signal to the phase splitter must be generated based on the duty-cycle of the input signal 102 and the desired phase relationship between the output signals 104, 106. When a phase difference of 90° between the output signals 104 and 106 is desired, the duty-cycle of the input signal to the phase-splitter 10 must be 50%.

The relationship between the duty-cycle of the input signal to the phase splitter and a phase difference $\phi_{diff}$ of the output signals 104, 106 is:

$$\phi_{diff} = duty\_cycle \times 180°, \quad (1)$$

where duty_cycle is the duty-cycle of the phase-splitter input signal expressed as a number less than 1. In FIG. 3, the duty-cycle of the input signal 102 is 30%, or 0.3, and the phase difference between the output signals 104 and 106 is $\phi_{diff} = 0.3 \times 180° = 54°$ as determined by equation (1) above. Thus, to obtain a fixed phase relationship of 90°, a duty-cycle corrector 400 is required to "correct" the 30% duty-cycle of the input signal 102 to produce a 50% duty-cycle signal for input to the phase-splitter 10, as shown in FIG. 4.

FIG. 5 illustrates a block diagram of the duty-cycle corrector 400. The rising and falling edges of the input signal 102 (having a duty-cycle of $K_{DC_{IN}}$) are slew-rate limited by a slew-rate limiter 402. Limiting the slew-rate of the rising and falling edges of the input signal 102 provides an opportunity to generate an output signal 302 having a duty-cycle controlled by an offset signal value. As shown in FIG. 6, the rising and falling edges 202, 204, respectively, of the input signal 102 are converted into rising and falling edges 502, 504, respectively, of an output signal 420 of the slew-rate limiter 402.

In FIG. 7, the rising and falling edges 502 and 504 of the output signal 420 have slopes in the amplitude-time plane (y-t plane). If reference levels 506 and 508 represent two zero crossing lines (i.e., the output signal 420 is positive above and negative below the zero crossing lines), the time between zero crossings of a positive portion of the output signal 420 is $t_1$ for the reference level 506 and $t_2$ for the reference level 508. If the duty-cycle of the output signal 420 is defined as the ratio between the time when the output signal 420 is positive and the output signal cycle time 1/f, then the duty-cycle of the output signal 420 is directly related to the selected reference levels 506, 508.

Returning to FIG. 5, the zero crossings of the output signal 420 are adjusted by an offset signal on signal line 428 through the summer 404. For example, if the value of the output signal 420 is zero volts at all the zero crossings, then subtracting a constant (relative to the frequency of the output signal 420) DC value from the output signal 420, effectively shifts the signal on signal line 422 downwards so that the zero crossings of the signal on signal line 422 rise relative to the output signal 420. Thus, the reference level 508 represents the offset signal and sets the value of $t_2$.

The output of the summer 404 is input to a clipper 406 through signal line 422. The clipper 406 generates the output signal 302 on signal line 424 having an increased slew rate as compared to the slew rate of the signal 420. In addition, the amplitude of the output signal 302 is limited to between a maximum value and a minimum value. The clipper 406 essentially sharpens the rising and falling edges of the signal 422 and generates the output signal 302 which is similar to the input signal 102 but has a duty cycle set by the zero crossings of the signal 422. A gain value of the clipper 406 is set so that a small positive value of the output of the summer 404 results in the output signal 302 having a maximum value and a small negative value of the output of the summer 404 results in the output signal 302 having a minimum value which is equal to and has the opposite polarity of the maximum value. Thus, the rising and falling edges of output signal 302 occur at times determined by the zero crossings of the summer 404 output signal on signal line 422. Accordingly, the duty-cycle of the output signal 302 is approximately equal to the duty-cycle of the output of the summer 404.

The change in the duty cycle of the output signal 302, $\Delta K_{DC}$, may be described rigorously as follows. As shown in FIG. 7 and discussed above, the reference levels 506, 508 determine the change in the duty-cycle of the output signal 302. The duty-cycle corresponding to the reference level 506 is $t_1$ divided by the cycle time 1/f, or $t_1 *f$, and the duty cycle corresponding to the reference level 508 is $t_2$ divided by the cycle time 1/f, or $t_2 *f$. Thus, for a $\Delta y$ change in the offset signal value, the reference level changes from the reference level 506 to the reference level 508. The change, $\Delta t$, in the time period t that the output signal 302 is above zero is related to $\Delta y$ and the slew rate $S_R$ as follows:

$$\Delta t = 2 \frac{\Delta y}{S_R} \quad (2)$$

The duty-cycle of the output signal 302 is the ratio between the time period when the output signal 302 is positive and the total cycle time of the output signal 302. Thus, the change in the duty-cycle may be expressed as follows:

$$\Delta K_{DC} = \frac{\Delta t}{1/f} = \Delta t * f = 2f \frac{\Delta y}{S_R}, \quad (3)$$

wherein f equals the frequency of the input signal 102.

Returning to FIG. 5, the offset signal on the signal line 428 is generated by an integrator 414 and an amplifier 412. The integrator 414 includes an amplifier 408 and an integrating capacitor 410. The integrator 414 integrates the output signal 302 to obtain a value which is the output signal 302 averaged over many cycles.

For example, if the output signal 302 has a duty cycle of exactly 50%, then the average value of the output signal 302 over many cycles is approximately zero. However, if the duty cycle decreases to, for example, 30%, then the average value of the output signal 302 would decrease and the output of the integrator 414 at signal line 426 also decreases. If the duty-cycle of the output signal 302 increases, then the average value of the output signal 302 increases and the output of the integrator 414 increases. Thus, the output of the integrator 414 reflects the duty-cycle of the output signal 302.

The output of the integrator 414 is amplified by the amplifier 412 to generate the offset signal on the signal line 428. The amplifier 412 increases the gain of a feedback loop formed by the integrator 414, the amplifier 412, the summer 404 and the clipper 406. The feedback loop is negative because the offset signal is input into a negative input terminal of the summer 404. Thus, the duty-cycle of the output signal 302 is controlled by the negative feedback loop. If connected as shown in FIG. 5, the duty-cycle of the output signal 302 would be maintained at 50%.

While not shown, the output of the integrator 414 may be offset by a shift value (assuming the integrator has a finite DC gain) so that the duty-cycle may be set to any value based on the shift value. For example, if a duty-cycle greater than 50% is desired, a negative shift value would be added to the output of the amplifier 412; alternatively, if a duty-cycle less than 50% is desired, a positive shift value may be added. In fact, the shift value may be controlled by other circuits (not shown) to dynamically set the desired duty-cycle of the output signal 302.

The following is a rigorous explanation of the operation of the duty-cycle corrector 400 shown in FIG. 5. A circuit equation for the forward path within FIG. 5, inputting a duty-cycle $K_{DC_{IN}}$ of the input signal 102 and outputting a duty-cycle $K_{DC_{OUT}}$ of the output signal 302 is:

$$K_{DC_{OUT}} = K_{DC_{IN}} + \Delta K_{DC} = K_{DC_{IN}} + 2f\frac{\Delta y}{S_R} \qquad (4)$$

The input to the integrator 414 is a unit-less quantity corresponding to the duty-cycle of the output signal 302. When the duty-cycle of the output signal 302 is 50%, the output of the integrator 414 is zero. Thus, the quantity $\Delta y$ which corresponds to the output of amplifier 412 can be expressed as:

$$\Delta y = (K_{DC_{OUT}} - 0.5) A_{INT} \qquad (5)$$

where $A_{INT}$ is the DC gain of the combination of the integrator 414, and amplifier 412. Substituting equation (5) for $\Delta y$ into equation (4) provides a modeling equation for the entire circuit illustrated in FIG. 5:

$$K_{DC_{OUT}} = K_{DC_{IN}} + 2f\frac{(K_{DC_{OUT}} - 0.5) A_{INT}}{S_R} \qquad (6)$$

If $E_{DC}$ represents the duty-cycle relative to 50%, such that $E_{DC} = K_{DC} - 0.5$, then $$E_{DC_{OUT}} + 0.5 = E_{DC_{IN}} + 0.5 + 2f\frac{E_{DC_{OUT}} A_{INT}}{S_R}, \qquad (7)$$

where $E_{DC_{OUT}} + 0.5 = K_{DC_{OUT}}$ and $E_{DC_{IN}} + 0.5 = K_{DC_{IN}}$ and $E_{DC_{OUT}} = K_{DC_{OUT}} - 0.5$.

Therefore, the closed loop response for the circuit illustrated in FIG. 5 is:

$$E_{DC_{OUT}} = E_{DC_{IN}} \frac{1}{1 - \frac{2f A_{INT}}{S_R}} \qquad (8)$$

Figure 8:
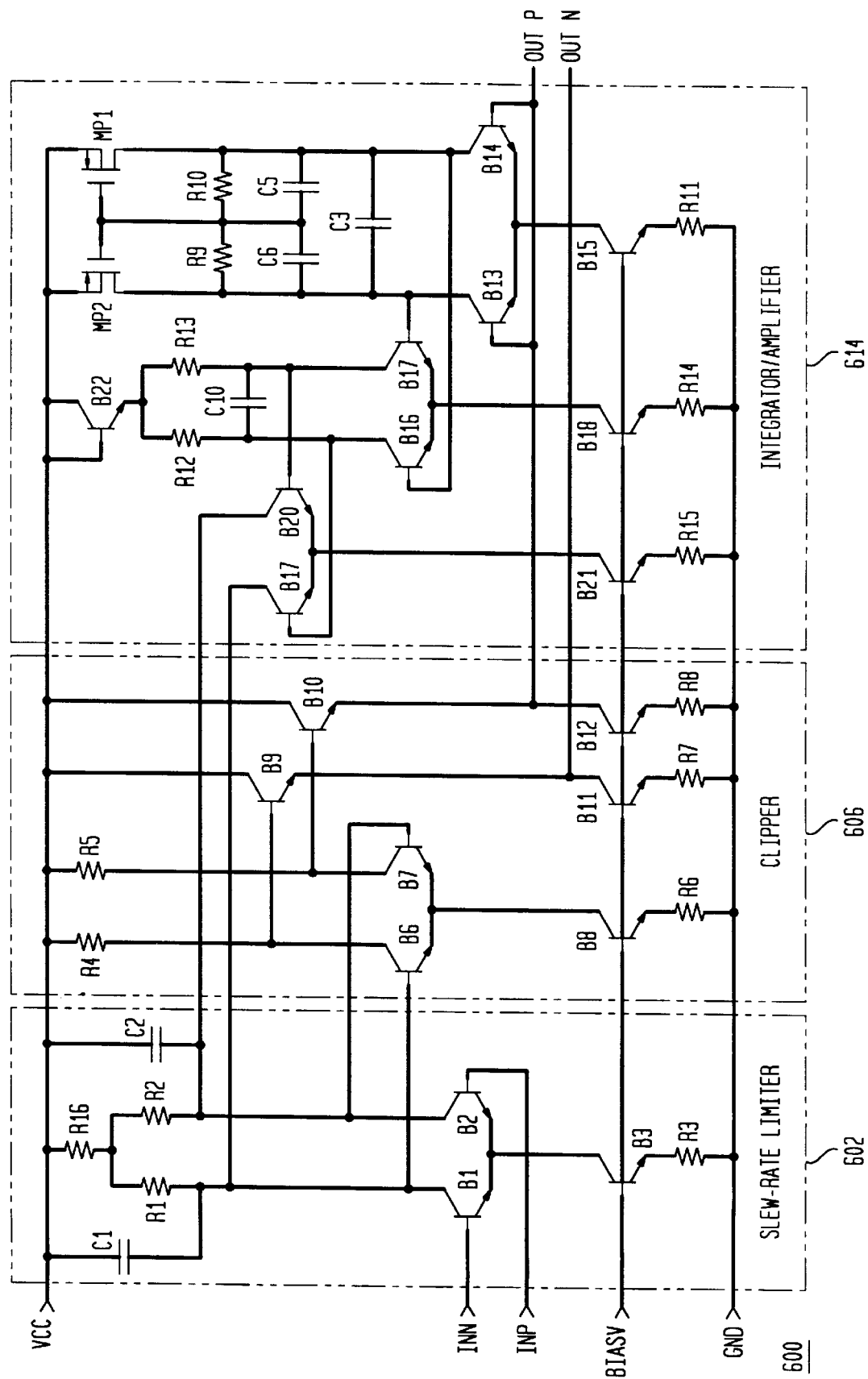
FIG. 8 shows a circuit diagram of an exemplary embodiment of the duty-cycle corrector.

FIG. 8 illustrates a duty-cycle corrector 600 which is an exemplary embodiment of the duty-cycle corrector 400. The duty-cycle corrector 600 includes a slew-rate limiter 602 (including summing nodes that correspond to the summer 404), a clipper 606, and an integrator/amplifier 614. While FIG. 8 shows bipolar and FET transistors, one of ordinary skill in the art would recognize how to implement the same finctions using other technologies such as p- and n-channel MOS transistors. Additionally, specific component values are used for the sake of discussion; however, other component values are feasible depending on specific circumstances in which the duty-cycle corrector 600 is being applied.

Figure 9:
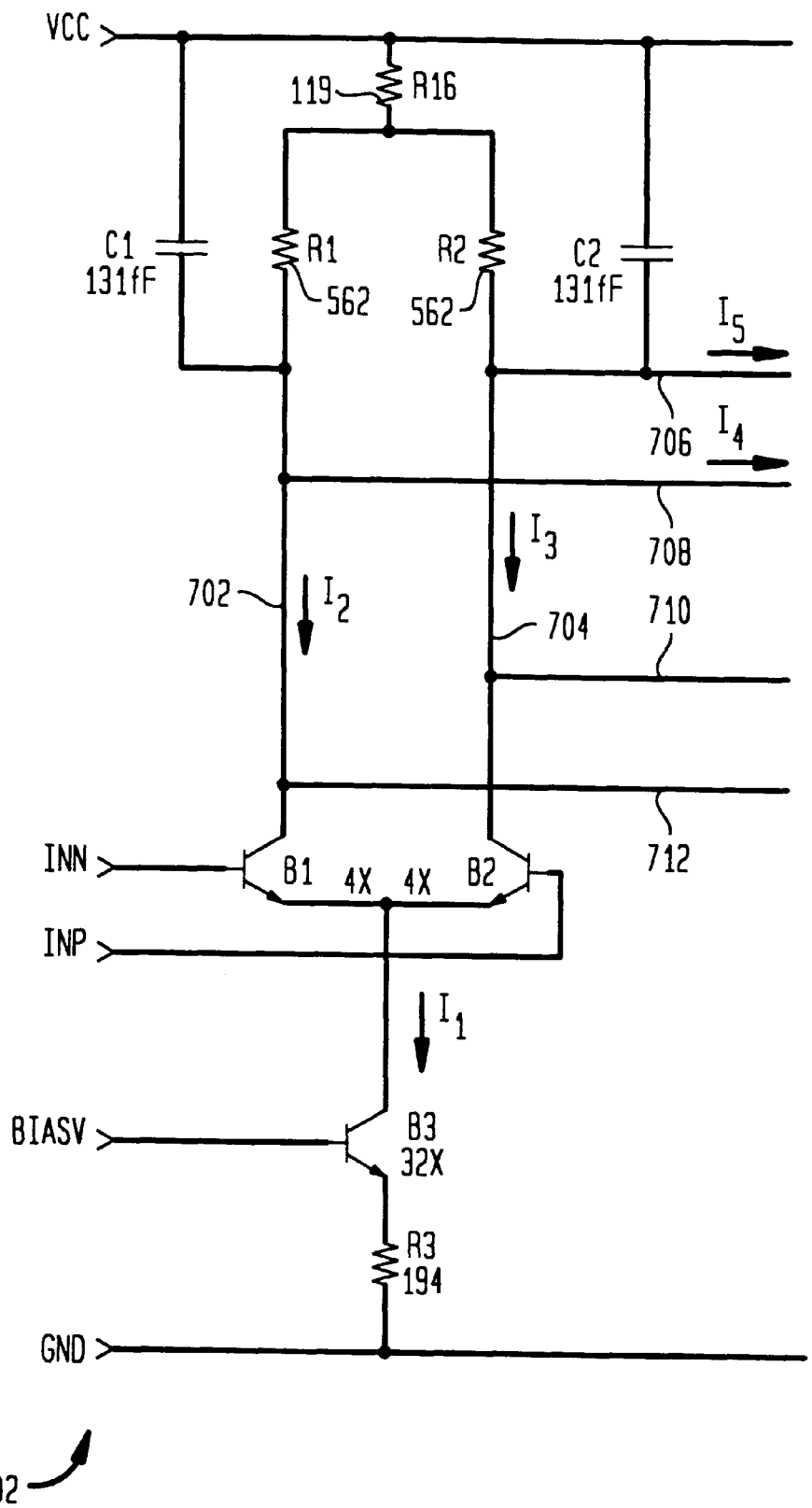
FIG. 9 shows a slew-rate limiter of the duty-cycle corrector.

In FIG. 8, transistors B3, B8, B11, B12, B21, B18, and B15 are biased by a constant bias voltage BIASV. Thus, the collector currents of these transistors are set by the emitter resistors R3, R6, R7, R8, R15, R14, and R11. Accordingly, the collector currents are constant and function as current sources for the components 602, 606 and 614. The components forming these current sources are assumed to be present and are not further mentioned in the discussion below unless necessary for clarity. Each of the components 602, 606 and 614 are discussed separately as follows:

FIG. 9 shows the slew-rate limiter 602. The slew-rate limiter 602 includes a pair of npn transistors B1 and B2, a pair of capacitors C1 and C2 and resistors R1, R2 and R16. I1 is the current of the current source, mentioned above, and I2 and I3 are currents flowing in the transistors B1 and B2, respectively. The sum of the currents I2 and I3 must equal to I1, assuming that the base currents of transistors B1 and B2 are negligible. When the inputs INN and INP to transistors B1 and B2, respectively, are at the same voltage, the currents I2 and I3 are identical (assuming that transistors B1 and B2 are a matched pair). Resistors R16, R1 and R2 convert the current values of I2 and I3 into voltage values at nodes 702 and 704. Because I2 is equal to I3 and R1 is equal to R2, the voltage values at nodes 702 and 704 are also equal. Thus, the voltage values at the nodes 702 and 704 are biased by the resistors R16, R1 and R2.

When the voltage of the input INN is greater than the voltage of the input INP, the transistor B1 is turned ON, the transistor B2 is turned OFF, the current I2 of the transistor B1 increases and the current I3 of the transistor B2 decreases. The increase in the current I2 causes the voltage at the node 702 to decrease and the decrease in the current I3 causes the voltage at the node 704 to increase. If the voltage of the input INP is greater than the voltage of the input INN, then the conditions opposite to the above conditions occur and the voltage of the node 702 increases while the voltage of the node 704 decreases.

The voltages at the nodes 702 and 704 increase (or decrease) until a maximum (or minimum) voltage is reached. The maximum voltage is set by the VCC−(I1 * R16) (and further set by current fed back from signal lines 706 and 708, as discussed below). The minimum voltage is set by VCC−(I1(R16+R1)) at node 702 and VCC−(I1 (R16+R2) at node 704 (both minimum voltages are further set by current fed back from signal lines 706 and 708, discussed below) as is well known in the art. The voltages at the nodes 702 and 704 are output to the clipper 606 through signal lines 712 and 710, respectively.

The slew rate of the voltages at the nodes 702 and 704 is controlled by the capacitors C1 and C2 and the resistors R1 and R2. The resistors and capacitors function as a standard RC (resistor-capacitor) circuit which is well known in the art. Thus, even though the difference between the input voltages INN and INP may change rapidly, the voltage values of the nodes 702 and 704 change at a rate that is determined by the capacitors C1 and C2 and the resistors R1 and R2. As shown in FIG. 9, the value of the capacitor C1 is set equal to the value of capacitor C2 and the value of the resistor R1 is set equal to the value of the resistor R2. Thus, the component values are set to produce slew rates of the voltages at the nodes 702 and 704 that are equal and opposite. For a specific embodiment, using BiCMOS (Bipolar CMOS), the current I1 is set at approximately 615 microamps ($\mu$A), R1 and R2 at approximately 562 ohms ($\Omega$), R16 at about 119 ohms ($\Omega$) and C1 and C2 at about 131 femto farads (fF). The slew rate $S_R$ is:

$$S_R = \frac{615\ \mu A}{500\ fF} = 1.2\ V/ns$$

The total capacitance of 500 fF is the sum of C1=131 fF and parasitic, wiring and Miller capacitance (not shown) of about 369 fF.

The signal lines 706 and 708 connect the output of the integrator/amplifier 614 to the nodes 702 and 704. The output of the integrator/amplifier 614 is the offset signal fed back in the form of currents I4 and I5. The nodes 702 and 704 serve as current summing nodes for the currents I2, I4 and I3, I5, respectively, and correspond to the summer 404 shown in FIG. 5. The currents I4 and I5 change slowly and may be considered constant with respect to the input signal 102. The sum of the currents I4 and I5 is constant because these currents are generated by the pair of common emitter transistors B19 and B20 (see FIG. 12) designed similarly to the slew-rate limiter circuit. The currents I4 and I5 basically adjust the minimum and maximum voltages of the nodes 702 and 704.

When the offset signal is zero, current I4 is equal to current I5 and the midpoints of the voltage swing ranges on nodes 702 and 704 are equal. When the offset signal is other than zero (e.g., I4>I5) then the midpoint voltage at the node 702 is reduced because current I4 must flow through resistor R1, thereby lowering the voltage at the node 702 independent of the current I2, and the maximum voltage at the node 704 is increased because the current I5 is decreased. Thus, the offset signal adjusts the midpoint voltages of the nodes 702 and 704.

While the offset signal controls the midpoint voltages of the nodes 702 and 704, the slew rate of the voltages at the nodes 702 and 704 are not affected because the slew rate is determined in an exponential manner completely by the currents I1, I2, the resistors R1, R2 and the capacitors C1, C2. The effect of the offset signal is to change the zero crossings of the summer output signal along the rising and falling edges of a signal represented by a difference of the voltages of the nodes 702 and 704.

Figure 10:
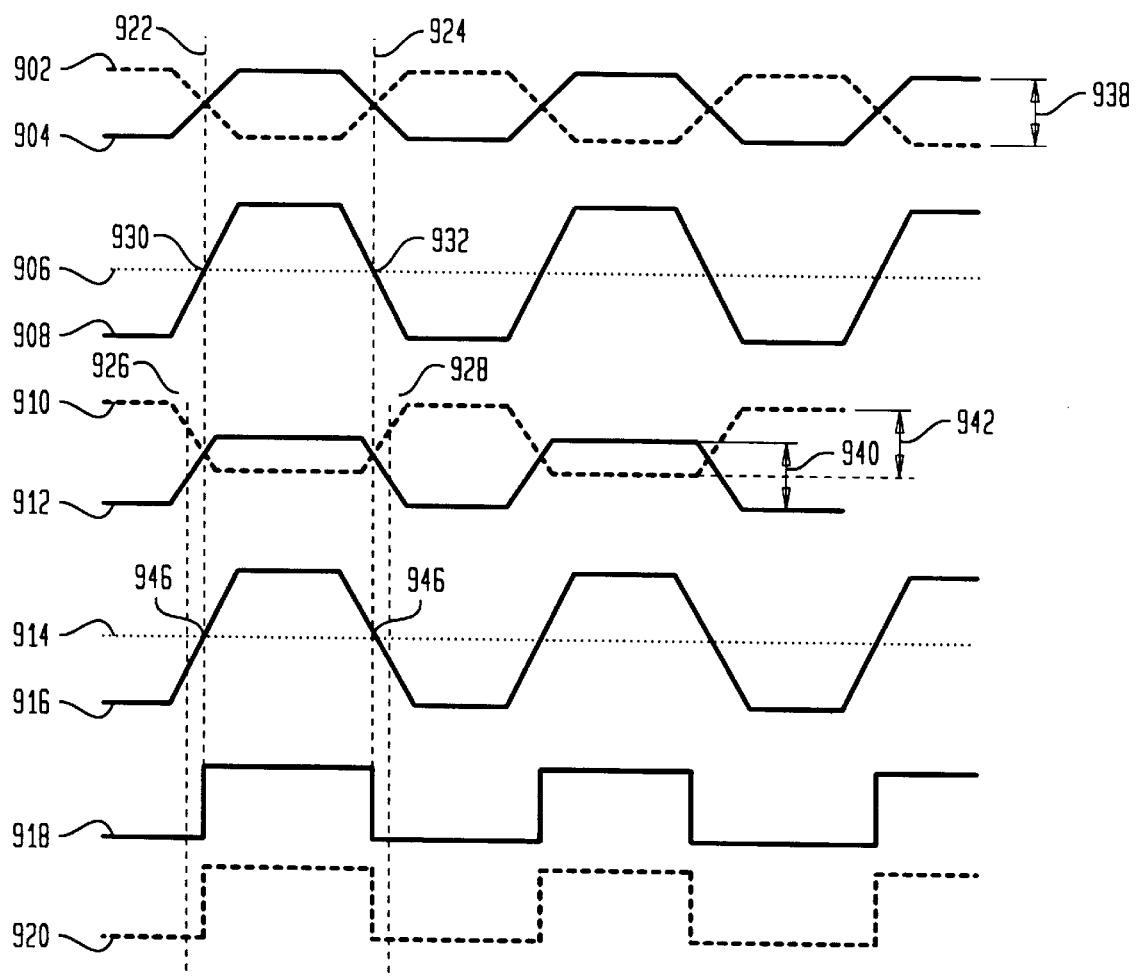
FIG. 10 shows samples of idealized waveforms of the slew-rate limiter.

FIG. 10 shows an example of how the offset signal affects the duty cycle of the duty-cycle corrector 600. The waveforms shown in FIG. 10 assume idealized conditions (e.g., completely linear rising and falling edges and the clipper 606 outputing a square wave having rising and falling edges matching the zero crossings of the output signals from the slew-rate limiter 602). FIG. 10 shows waveforms 902, 904, 908 and 918 that correspond to the signals of the duty-cycle corrector 600 when the duty-cycle of the input signal 102 is exactly 50% and the offset signal is zero (current I4 is equal to current I5). Signal waveforms 910, 912, 916 and 920 represent signals in the duty-cycle corrector 600 when the duty-cycle of the input signal 102 is not at 50% and the offset signal has a non-zero value.

The waveform 902 represents the voltage at the node 702 while the waveform 904 represents the voltage at the node 704 when the offset signal is zero. The waveforms 902 and 904 are exactly identical but offset from each other by 180°. The voltages at the nodes 702 and 704 are equal when the waveforms 902 and 904 cross each other (indicated by dash lines 922 and 924). The total voltage swing range 938 is equal to the difference between the maximum and minimum voltages.

The waveform 908 represents the difference between the voltages at node 702 and 704. Thus, the values of the waveform 908 are obtained by subtracting the value of waveform 902 from the value of the waveform 904. At zero crossing points 930 and 932, the waveform 908 has a zero voltage value. Thus, line 906 represents a reference level corresponding to the offset signal and the waveform 908 has a zero voltage value when intersecting the reference level line 906.

If the clipper 604 amplifies the waveform 908, then the output of the clipper 604 is represented by the waveform 918. The rising edge of the waveform 918 corresponds to the zero crossing point 930 of the waveform 908 and the falling edge of the waveform 918 corresponds to the zero crossing point 932 of the waveform 908.

When the input signal 102 has a duty-cycle other than 50%, the offset signal is adjusted by the integrator/amplifier 614 to compensate for the difference between the duty-cycle of the input signal 102 and a duty cycle of 50%. The offset signal changes the midpoint voltages of the nodes 702 and 704 in opposite directions so that the midpoint voltage of the node 702 is higher than the midpoint voltage of the node 704, for example. Thus, if the waveform 910 corresponds to the voltage waveform of the voltage at the node 702 and the waveform 912 represents the voltage waveform of the node 704, the voltage swing ranges 942, 940 are equal to the voltage swing range 938 but the midpoint between the minimum and maximum voltages of 912 is lower than that of 910. Because the midpoints have changed, the voltage waveforms of the nodes 702 and 704 also change as shown in FIG. 10.

Waveform 916 corresponds to waveform 908 for the voltage waveforms 910 and 912. Lines 926 and 928 designate the time positions where the waveforms 910 and 912 would intersect each other if no feed back current were applied. Line 914 represents the reference level corresponding to the offset signal when the duty cycle of the input signal 102 is not at 50%. As can easily be observed, the line 914 is closer to the maximum value of the waveform 916 than compared to the proximity of line 906 relative to the maximum value of the waveform 908. Thus, the offset signal moves the reference level (i.e. lines 906 and 914) closer to the top of the waveform 916 so that the zero crossing points 944 and 946 still occur at the same time as the waveform 908. This movement maintains the same duty cycle of the output waveform 920 of the clipper 604.

Figure 11:
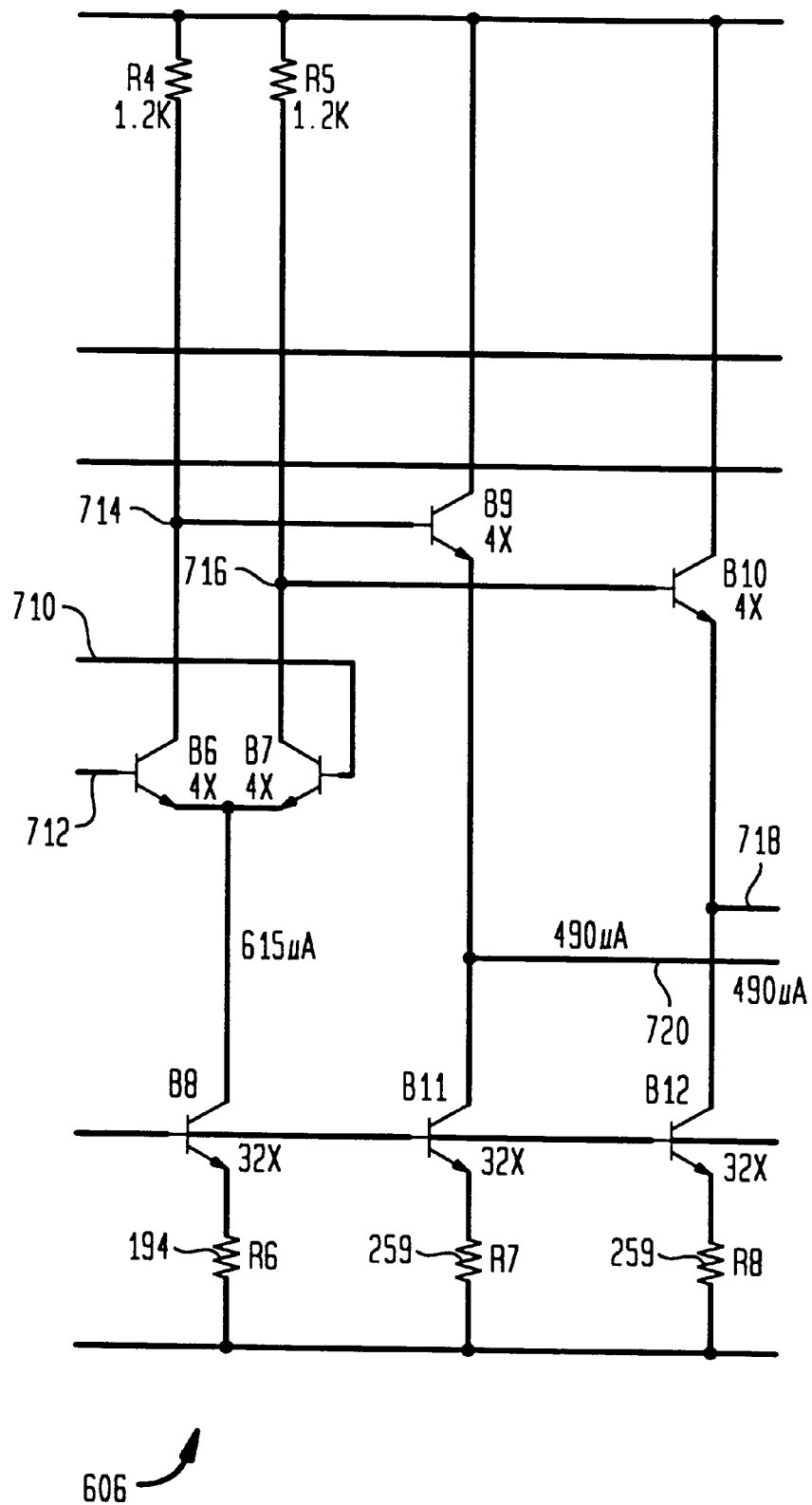
FIG. 11 shows a clipper of the duty-cycle corrector.

FIG. 11 shows the clipper 606. The clipper 606 functions in a similar way to the slew-rate limiter 602 with the addition of two emitter-followers (transistors B9 and B10) for level shifting and buffering. The voltages of the nodes 702 and 704 are connected to the inputs of the clipper 606 through signal lines 712 and 710, respectively. The signal lines 712 and 710 are connected to the base terminals of the transistors B6 and B7 which amplifies the voltage difference between the signals on the signal lines 712 and 710 and outputs an output voltage at nodes 714 and 716. The output voltages are current buffered by the transistors B9 and B10 to generate the output signal 302 on signal lines 718 and 720.

The transistors B6 and B7 amplify the voltage difference of the signals on signal lines 712 and 710 so that the slew rate of the voltage signals on the nodes 714 and 716 is significantly greater and symmetry is restored to the signals. Thus, the output signal on signal lines 718 and 720 is a signal having rising and falling edges with high slew rates.

Figure 12:
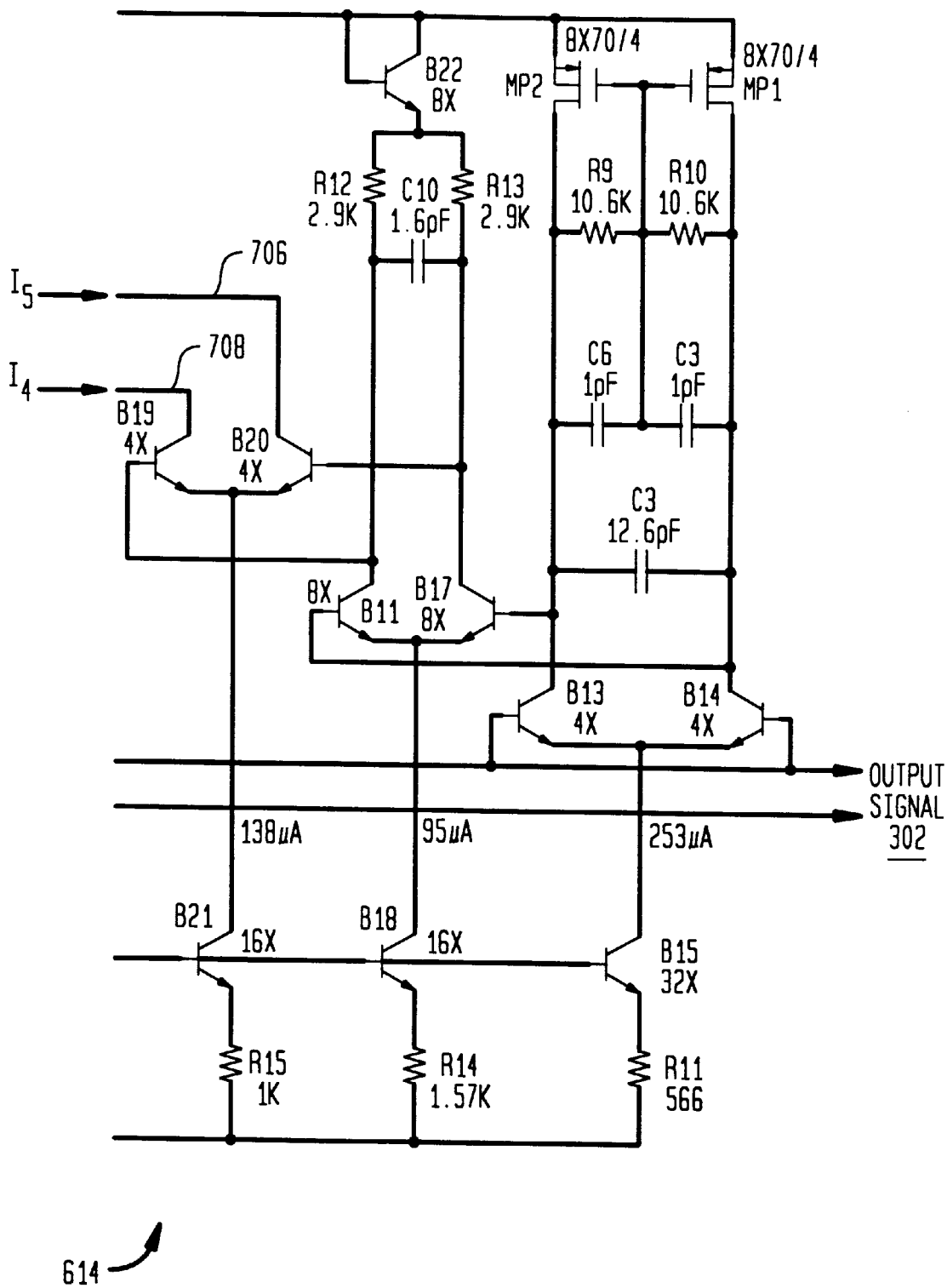
FIG. 12 shows an integrator/amplifier circuit of the duty-cycle corrector.

FIG. 12 shows the integrator/amplifier 614. Transistors B13, B14, B15, MP1 and MP2, resistors R9, R10 and R11 and capacitors C3, C5 and C6 form the integrator while transistors B16, B17, B18 and B22, resistors R12, R13, and R14 and capacitor C10 form a first stage amplifier, and transistors B19, B20 and B21 and resistor R15 form a second stage amplifier. As with the slew-rate limiter 602, the transistors B13 and B14 are configured in a common-emitter structure. The total capacitance of capacitors C3, C5 and C6 is the integrator capacitor corresponding to the integrator capacitor C10 of FIG. 5.

Components C5, C6, R9, R10 and MP1 and MP2 act as a self-biasing current source. The resistors R9 and R10 bias the common gate of MP1 and MP2 and set the DC gain of the integrator. This configuration provides a low common-mode impedance and a relatively large differential impedance.

The integrator balances several significant factors including the current flowing through transistor B15 and resistor R11 as well as the sizes of the capacitor C3 and resistors R9 and R10. If this current is increased, then the integrator gain is improved but the amount of ripple in the output signal of the integrator also increases. Therefore, the size of the integrating capacitor C3 must be increased to keep the ripple from becoming so large that it affects the first stage of the amplifier causing the transistors B16 and B17 to operate in a non-linear region. Taking into consideration that the capacitor C3 has a relatively large value of 12.6 pF, the current through transistor B15 must be set to provide an adequate gain while keeping the capacitor C3 to a tolerable quantity.

In the first stage amplifier, the transistors B16 and B17 are kept in a linear region. For the specific component values shown in FIG. 12, the voltage swing from the integrator has a peak differential voltage of approximately 9 mV which is small enough to keep the first stage amplifier in the linear region.

The second stage amplifier also operates in the linear region. Therefore, any ripple on the signal received from the first stage amplifier causes the slew-rate of the voltages at the nodes 702 and 704 to be affected in an undesirable way because the collectors of the transistors B19 and B20 generate the offset signal in the form of the currents I4 and I5. Thus, the first stage amplifier includes the capacitor C10 to limit a bandwidth of the first stage amplifier to significantly attenuate ripple while avoiding instability with a dominant pole set by the integrator. If the input signal frequency is 270 MHz, then the bandwidth of the first stage may be limited to 17 MHz using the particular component values shown in FIG. 12.

The second stage amplifier converts a voltage signal from the first stage amplifier into the currents I4 and I5. The current in the second stage amplifier (I4+I5) is relatively small (about 138 $\mu$A for the component values shown) compared with the current in the slew-rate limiter 602 (615 $\mu$A). Thus, the noise contribution of the second stage amplifier to the output signal 420 is minimized. Also, the currents I4 and I5 are minimized to avoid head-room problems at the slew-rate limiter 602 (i.e., minimum voltages may be too low). If the current (I4+I5) in the second stage amplifier is the same as the current in the slew-rate limiter (I2+I3), the reference level could be adjusted to the upper and lower extremes of the slew-rate limiter's output signal.

For the component values shown in FIGS. 9, 11 and 12, a calculated amount of duty-cycle correction is $E_{DC_{OUT}} = E_{DC_{IN}} \times 0.18$. Therefore, this embodiment of the invention is capable of correcting a 3% error on the incoming duty-cycle to approximately a 0.5% error at the output.

While this invention has been described in conjunction with a specific embodiment thereof, it is evident that many alternatives, modifications, and variations will be apparent to those skilled in the art. For example, the individual components utilized in the illustrated embodiment may be substituted for alternative components depending on the particular design constraints required of the artisan of ordinary skill. Further, the particular design constraints may be altered to provide a corrected duty-cycle other than 50%. Accordingly, the preferred embodiments as set forth herein are intended to be illustrative, not limiting. Various changes may be made without departing from the spirit and scope of the invention as defined in the following claims.

What is claimed is:

1. A duty-cycle corrector, comprising:

a clipper receiving an input signal having first rising edges and first falling edges;

a duty-cycle detector coupled to the clipper, the duty-cycle detector detecting a duty-cycle of an output signal of the clipper and generating an offset signal based on the duty-cycle, wherein the duty-cycle is changed by changing positions of zero crossings along the first rising and the first falling edges said slew-rate limiter comprising a differential circuit, of the input signal based on the offset signal; and a slew-rate limiter coupled to the clipper, said slew-rate limiter receiving an external signal having second rising edges and second falling edges and generating the input signal having the first rising edges and first falling edges, wherein the slew-rate limiter limits slew rates of the first rising edges and first falling edges of the iniput signal based on the second rising edges and the second falling edges of the external signal.

2. The duty-cycle corrector of claim 1, wherein each of the first rising edges has a first slope in an amplitude-time plane and each of the first falling edges has a second slope in the amplitude-time plane, the positions of the zero crossings along an amplitude axis of the first rising and the first falling edges being changed according to the offset signal resulting in a change of time between adjacent zero crossings determined by the first and the second slopes.

3. The duty-cycle corrector of claim 2, wherein the slew-rate limiter comprises:

a first pair of transistors generating the first rising and the first falling edges; and a first resistor-capacitor pair coupled to a first transistor of the first pair of transistors and a second resistor-capacitor pair coupled to a second transistor of the first pair of transistors first and the second resistor-capacitor pairs limit the slew-rates of the first rising and the first failings edges.

4. The duty-cycle corrector of claim 1, wherein the clipper generates the clipper output signal by amplifying the input signal and limiting an amplitude of the clipper output signal to be between a maximum value and a minimum value.

5. The duty-cycle corrector of claim 1, wherein rising edges and falling edges of the clipper output signal correspond to positions of the zero crossings of the clipper input signal along a time axis.

6. The duty-cycle corrector of claim 4, wherein rising edges and falling edges of the clipper output signal correspond to positions of the zero crossings of the clipper input signal along a time axis.

7. The duty-cycle corrector of claim 4, wherein the clipper comprises:

a second pair of transistors amplifying the input signal;

a pair of resistors coupled to the second pair of transistors; and a third pair of transistors coupled to the second pair of transistors and configured as emitter followers, the third pair of transistors generating the clipper output signal based on an output of the second pair of transistors.

8. The duty-cycle corrector of claim 4, wherein the duty-cycle detector comprises:

an integrator receiving the clipper output signal, the integrator integrating the clipper output signal to generate an integrator output signal that corresponds to the duty-cycle of the clipper output signal; and an amplifier that receives and amplifies the integrator output signal to generate the offset signal.

9. The duty-cycle corrector of claim 8, wherein the integrator comprises:

a fourth pair of transistors having integrator input terminals that receive the clipper output signal and integrator output terminals that output an integrator output signal;

an integrator biasing circuit coupled to the integrator output terminals; and an integrator capacitor coupled to the integrator biasing circuit and the integrator output terminals, the integrator capacitor integrating the clipper output signal to produce the integrator output signal that reflects the duty-cycle of the clipper output signal.

10. The duty-cycle corrector of claim 8, wherein the integrator comprises:

a fourth pair of transistors having integrator input terminals that receive the clipper output signal and integrator output terminals that output the integrator output signal;

an integrator biasing circuit coupled to the integrator output terminals; and an integrator capacitor coupled to the integrator biasing circuit and the integrator output terminals, the integrator capacitor integrating the clipper output signal to produce the integrator output signal that reflects the duty-cycle of the clipper output signal.

11. The duty-cycle corrector of claim 8, wherein the amplifier comprises:

a first stage amplifier coupled to the integrator that amplifies the integrator output signal; and a second stage amplifier coupled to the first stage amplifier, the second stage amplifier converting an output signal of the first stage amplifier into a current output representing the offset signal and outputting the offset signal.

12. The duty-cycle corrector of claim 11, wherein the first stage amplifier comprises:

a fifth pair of transistors receiving the integrator output signal through first stage input terminals, the fifth pair of transistors amplifying the integrator output signal to generate a first stage output signal at first stage output terminals; and a first stage biasing circuit that includes a biasing transistor, two resistors and a capacitor, the capacitor sets a bandwidth of the first stage amplifier that reduces a ripple in the first stage output signal at a frequency of the input signal.

13. The duty-cycle corrector of claim 11, wherein the second stage amplifier comprises a sixth pair of transistors coupled to the first stage output terminals, the sixth pair of transistors converting the first stage output signals into the offset signal.

14. A method for correcting a duty-cycle, comprising:

receiving an input signal having first rising edges and first falling edges in a clipper;

receiving an external signal having second rising and second falling edges;

limiting slew rates of the first rising edges and the first falling edges of the input signal using a slew-rate limiter, the comprises a differential circuit the frequency of the input signal being based on the frequency of the external signal;

detecting a duty-cycle of an output signal of the clipper;

generating an offset signal based on the duty-cycle; and changing positions of zero crossings along the first rising and the first falling edges of the input signal based on the offset signal to change the duty-cycle signal.

15. The method of claim 14, wherein each of the first rising edges has a first slope in an amplitude-time plane and each of the first falling edges has a second slope in the amplitude-time plane, the positions of the zero crossings along an amplitude axis of the first rising and the first falling edges being changed according to the offset signal resulting in a change of time between adjacent zero crossings determined by the first and the second slopes.

16. The method of claim 14, wherein the clipper generates the output signal by amplifying the input signal and limiting an amplitude of the clipper output signal to be between a maximum value and a minimum value.

17. The method of claim 15, wherein rising edges and falling edges of the clipper output signal correspond to positions of the zero crossings of the input signal along a time axis.

18. The duty-cycle corrector of claim 3, wherein the first pair of transistors are bipolar transistors.

19. The duty-cycle corrector of claim 7, wherein the second pair of transistors and the third pair of transistors are bipolar transistors.

20. The duty-cycle corrector of claim 10, wherein the fourth pair of transistors are bipolar transistors and said integrator biasing circuit comprises a pair of p-channel devices, two resistors and two capacitors.

21. The duty-cycle corrector of claim 12, wherein the fifth pair of transistors are bipolar transistors.

22. The duty-cycle corrector of claim 13, wherein the sixth pair of transistors are bipolar transistors.

* * * * *